(12) United States Patent
Mathai et al.

(10) Patent No.: US 10,018,788 B2
(45) Date of Patent: Jul. 10, 2018

(54) PHOTONIC INTERPOSER WITH WAFER BONDED MICROLENSES

(71) Applicant: HEWLETT PACKARD ENTERPRISE DEVELOPMENT LP, Houston, TX (US)

(72) Inventors: Sagi Varghese Mathai, Sunnyvale, CA (US); Michael Renne Ty Tan, Menlo Park, CA (US); Wayne Victor Sorin, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/522,228

(22) PCT Filed: Oct. 28, 2014

(86) PCT No.: PCT/US2014/062619
§ 371 (c)(1),
(2) Date: Apr. 26, 2017

(87) PCT Pub. No.: WO2016/068876
PCT Pub. Date: May 6, 2016

(65) Prior Publication Data
US 2017/0315299 A1    Nov. 2, 2017

(51) Int. Cl.
*G02B 6/32* (2006.01)
*G02B 6/30* (2006.01)
(Continued)

(52) U.S. Cl.
CPC ............... *G02B 6/30* (2013.01); *G02B 6/32* (2013.01); *G02B 6/34* (2013.01); *G02B 6/423* (2013.01);
(Continued)

(58) Field of Classification Search
CPC .......... G02B 6/30; G02B 6/4292; G02B 6/32; G02B 6/34; G02B 6/423; G02B 6/4269;
(Continued)

(56) References Cited

U.S. PATENT DOCUMENTS 6,865,006 B2 *  3/2005  Sakane ............... G02B 6/4208
                                                  359/251
7,457,490 B2   11/2008  Rudmann et al.
(Continued)

OTHER PUBLICATIONS

Campenhout, J.V., et al., Silicon-Photonics Devices for Low-Power, High-Bandwidth Optical I/O [online], Feb. 27, 2012, Retrieved from the Internet Sep. 25, 2014, <http://www.photonics.intec.ugent.be/download/pub 2955.pdf > ].
(Continued)

*Primary Examiner* — Ellen Kim
(74) *Attorney, Agent, or Firm* — Tarolli, Sundheim, Covell & Tummino L.L.P.

(57) ABSTRACT

A silicon photonic (SiPh) packaging assembly includes a SiPh interposer and a wafer. The SiPh interposer has one or more optical gratings disposed thereon to couple an optical signal traversing the wafer. The wafer is bonded to the interposer, with the wafer including one or more microlenses, each microlens aligned with a respective optical grating and designed to direct the optical signal traversing the wafer at a desired angle.

14 Claims, 6 Drawing Sheets

(51) Int. Cl.
*G02B 6/42* (2006.01)
*H01L 23/00* (2006.01)
*G02B 6/34* (2006.01)

(52) U.S. Cl.
CPC ........... *G02B 6/428* (2013.01); *G02B 6/4208* (2013.01); *G02B 6/4269* (2013.01); *G02B 6/4292* (2013.01); *H01L 24/16* (2013.01); *H01L 24/81* (2013.01); *G02B 6/4267* (2013.01); *H01L 2224/16145* (2013.01); *H01L 2224/16225* (2013.01); *H01L 2224/73253* (2013.01); *H01L 2224/81815* (2013.01); *H01L 2924/15311* (2013.01); *H01L 2924/19* (2013.01)

(58) Field of Classification Search
CPC ....... G02B 6/4208; G02B 6/428; H01L 24/81; H01L 24/16; H01L 2924/15311; H01L 2224/16145; H01L 2924/19; H01L 2224/81815
See application file for complete search history.

(56) References Cited

U.S. PATENT DOCUMENTS

| | | |
|---|---|---|
| 8,821,040 B2 | 9/2014 | Bowen et al. |
| 2010/0296163 A1* | 11/2010 | Saarikko ............... G02B 5/1814 359/567 |
| 2011/0123149 A1 | 5/2011 | Hemenway, Jr. et al. |
| 2012/0121218 A1 | 5/2012 | Kim et al. |
| 2012/0177381 A1* | 7/2012 | Dobbelaere ............. H01L 21/84 398/139 |
| 2013/0182998 A1 | 7/2013 | Andry et al. |
| 2013/0313668 A1 | 11/2013 | Spencer et al. |
| 2014/0010498 A1 | 1/2014 | Verslegers et al. |

OTHER PUBLICATIONS

PCT/ISA/KR, International Search Report, dated Jul. 28, 2015, PCT/US2014/062619, 14 pages.
Watanabe, K., et al., Silica-based Opticalinterposer for Si Photonics [online], Jun. 14-19, 2009, IEEE, Retrieved from the Internet Sep. 25, 2014, 1 page, http://ieeexplore ieee org/stamp/stamp jsp?arnumber=5191537 >.

* cited by examiner

PHOTONIC INTERPOSER WITH WAFER BONDED MICROLENSES

BACKGROUND

Silicon photonics (SiPh) is the study and application of photonic systems which use silicon as an optical medium. The silicon is usually patterned with precision on a circuit board or device into microphotonic components in such a way as to achieve a desired functionality. An interposer serves as an electrical interface routing between a plurality of connections of a circuit board or other device. In communicating with networked components, a coupling can be used to connect an interposer to optical fiber systems to transmit and receive signals.

DETAILED DESCRIPTION

This disclosure relates to a solder reflowable silicon photonic (SiPh) interposer assembly with microlenses and optical connector mating features and methods to make the same. The microlenses are fabricated on a glass, glass ceramic, or Si wafer that can be bonded to the SiPh interposer at the wafer scale. Optical signals entering or exiting the SiPh interposer are coupled to the wafer using grating couplers. The microlenses of the wafer serve to collimate and focus the optical signals exiting and entering the grating couplers and couples the signals to expanded beam fiber optic connectors. By leveraging the alignment capabilities available in silicon integrated circuit and Microelectromechanical systems (MEMS) foundries, a SiPh interposer packaging platform can be fabricated to couple optical signals from associated devices to a fiber optic connector with high precision and favorable alignment tolerances.

Figure 1:
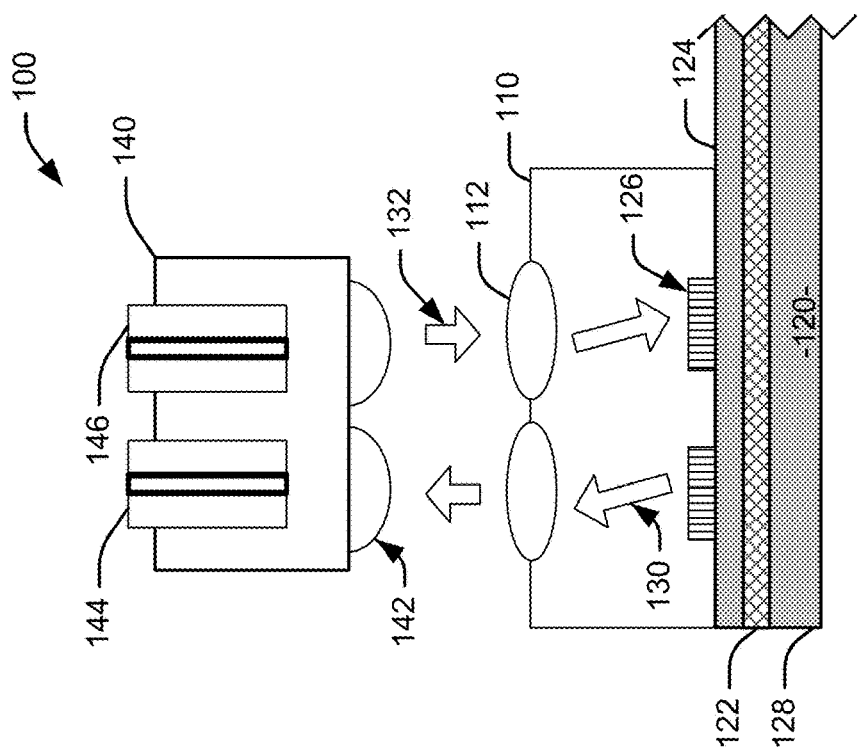
FIG. 1 illustrates an example SiPh interposer assembly.

FIG. 1 illustrates a SiPh interposer assembly 100 that includes a wafer 110 bonded to a SiPh interposer 120, and a fiber optical connector 140. In the example of FIG. 1, the wafer 110 can be fabricated from a substantially transparent glass material with a coefficient of thermal expansion (CTE) matched to silicon in order to facilitate precision bonding to the SiPh interposer 120 when, for example, heat is used in the bonding process. The wafer 110 can include one or more lenses 112 that can be etched on a surface of the wafer 110 prior to bonding. An antireflective coating can also be applied to lens 112 where the wafer 110 interfaces with an air gap, thereby reducing optical signal reflection. The SiPh interposer 120 can include an active silicon layer 124 to interface with a surface of the wafer 110. The SiPh interposer 120 can be a layered substrate, with the active silicon layer 124 separated from a layer of silicon 128 by an insulating layer 122 to result in a silicon on insulator (SOI) substrate. Passive and active optical elements, such as but not limited to waveguides, modulators, and photodetectors, can be fabricated on the SiPh interposer to route, modulate, and detect optical signals, respectively.

One or more gratings 126 can be formed on the active silicon layer 124 to transmit and/or receive optical signals 130, 132 from/to optical waveguides in the SiPh interposer 120. Although FIG. 1 shows gratings 126 as raised blocks, gratings 126 can alternatively be a one or two dimensional grating pattern etched into the active silicon layer 124. The one or more lenses 112 are formed on the wafer 110 such that, when bonded to the active silicon layer 124, signals 130, 132 traversing through lens 112 are transmitted and/or received by the gratings 126 at an angle predetermined to optimize signal capture. As shown, signal 130 is propagating through wafer 110 at an obtuse angle relative to the wafer 110/active silicon layer 124 interface. However, as the signal 130 propagates through an air gap separating the lens 112 and a lens 142 of fiber optical connector 140, the signal 130 is aligned with the optical axis of the lens 112, and orthogonal to the interface surface. Thus, the lens 112 serves to collimate and tilt the signal 130 to relax the alignment tolerance in three dimensions between the SiPh interposer 120 and external expanded beam fiber optical connector 140. This is achieved by integrating the wafer 110 and microlenses 112 on the SiPh interposer 120 to tilt and focus the signal 132 entering the interposer or tilt and collimate the signal 130 exiting the interposer. Although signal 130 is oriented away from the grating 126 and signal 132 is directed toward grating 126, the direction is for illustration purposes only. Both signals can be in a single direction, the orientations may be exchanged, or the angles may be different depending on the desired functionality.

The optical fiber connector 140 further includes one or more optical fibers 144, 146 aligned with a lens 142 to transmit and/or receive signals 130, 132. Optical fibers 144, 146 can be used in fiber-optic communications, where signals can be transmitted over longer distances and at higher bandwidths (e.g., data rates) than resistive cables. Moreover, optical fibers 144, 146 are better suited than metal wires to transmit signals over long distances as signals travelling along the fibers are less subject to signal degradation and are immune to electromagnetic interference. By utilizing MEMS fabrication techniques, mechanical alignment and mating features for the fiber optic connector 140 can be precisely aligned to the microlenses 112. Thus, the wafers 110, and microlenses 112 formed thereon, are aligned with the optical fibers 144, 146 housed in optical fiber connectors 140, resulting in a desired orientation and integrity of the signals entering and exiting the SiPh interposer 120. The features described herein cooperate to eliminate the need to actively align multiple optical elements to achieve the desired signal orientation and integrity, which improves performance and reduces assembly time and complexity.

Figure 2:
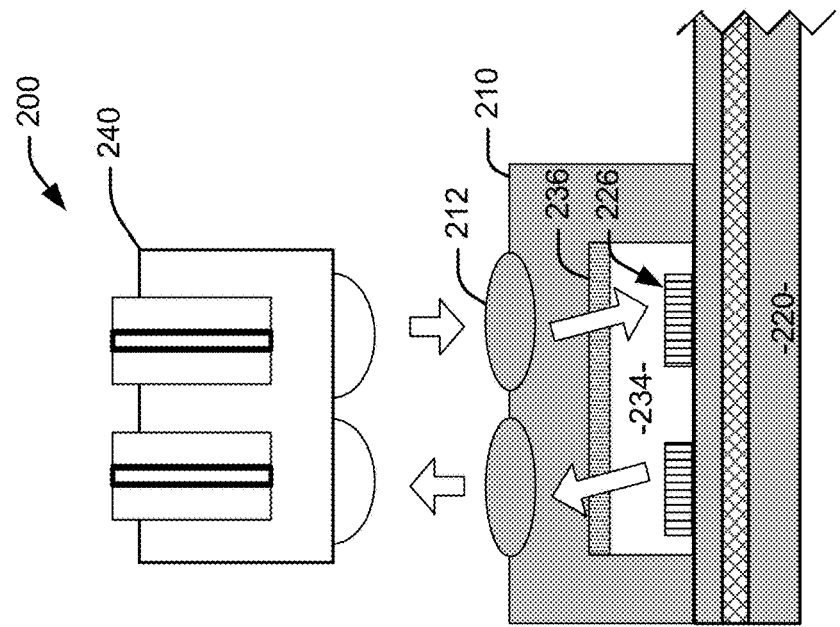
FIG. 2 illustrates another example SiPh interposer assembly.

FIG. 2 illustrates another SiPh interposer assembly 200 where a wafer 210 as well as lenses 212 formed thereon is made from silicon. The wafer 210 is also bonded to a SiPh interposer 220, as in the example of FIG. 1, yet the CTE is substantially equal due to the use of a silicon wafer 210. Although the silicon wafer 210 is substantially transparent, the index of refraction of silicon, at approximately 3.4, is much higher than that of glass (approximately 1.5) or air (approximately 1.0). A cavity 234 can be etched in wafer 210 in an area surrounding one or more gratings 226. As such, the cavity 234 can be filled with a fluid, such as air, a lower refractive solid, such as glass, or can be a vacuum. Thus, signals entering and exiting the gratings which are formed from silicon, transition from a high index material (silicon) to a low index material within the cavity. Additionally, an antireflective coating 236 can be applied where signals enter and exit the wafer 210, for example, the air/wafer interface and the cavity/wafer interface, to reduce signal degradation. Further, additional lenses can be formed on the cavity/wafer interface depending on the desired application. The result is the SiPh interposer assembly 200 mated with a fiber optical connector 240 with an improved alignment tolerance.

Figure 3:
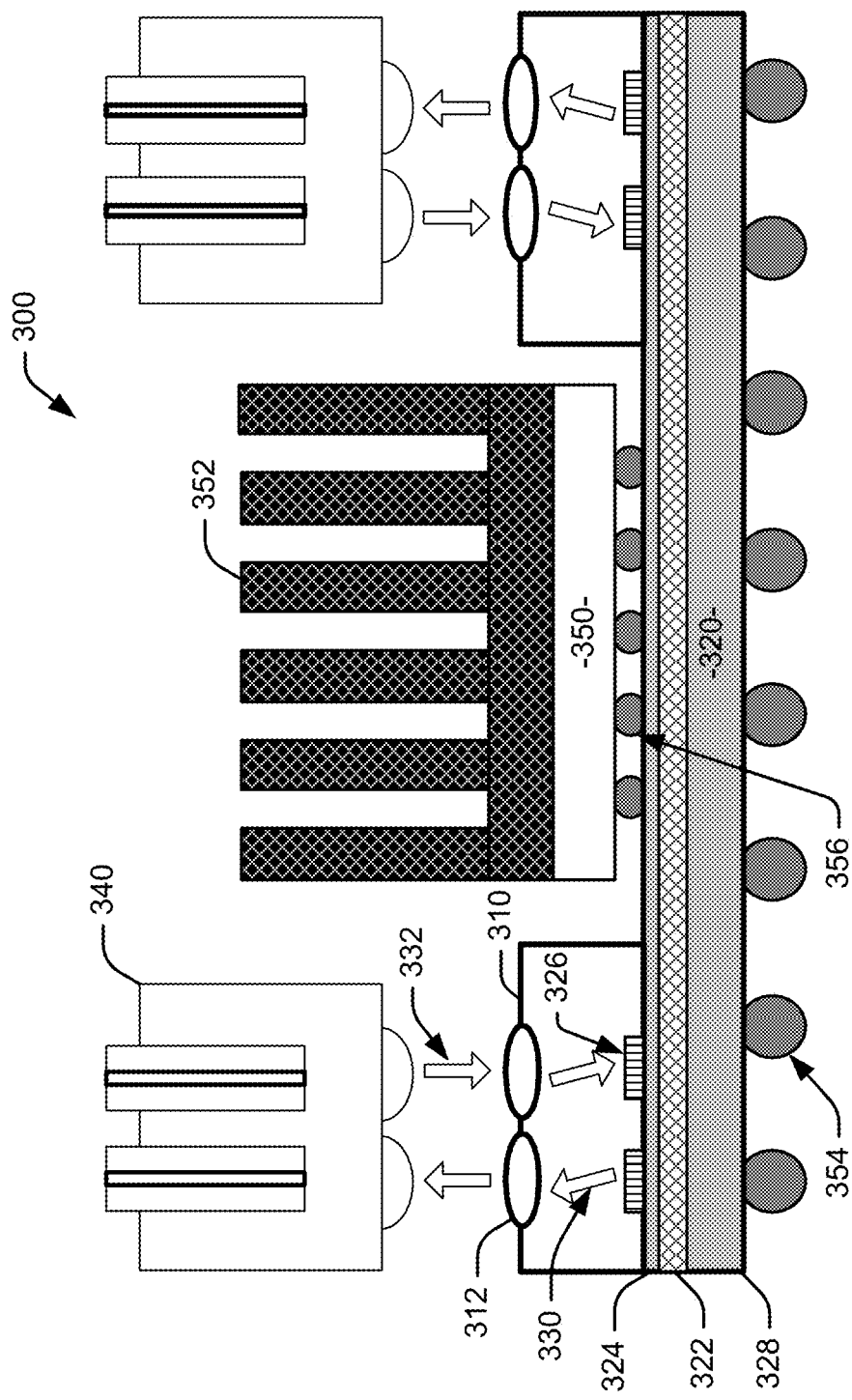
FIG. 3 illustrates an example SiPh interposer assembly with associated components.

FIG. 3 illustrates a SiPh interposer platform 300. The platform 300 includes a SiPh interposer 320 having a base silicon layer 328, an insulating layer 322 and an active silicon layer 324. Silicon can be used as the substrate for integrated circuits as well as to create hybrid devices where optical and electronic components are integrated onto a single platform. Accordingly, the SiPh interposer 320 serves as a platform onto which an integrated circuit (IC) chip 350 can be flip chip mounted to improve electrical signal integrity between the IC 350 and active optical elements in the SiPh interposer 320. One or more wafers 310 are formed with one or more lenses 312 and bonded to the SiPh interposer 320 in order to couple optical signals to and from optical fibers housed in optical fiber connector 340.

The SiPh interposer platform 300 can be connected to a ball grid array (BGA) 354 for surface mounting onto a larger printed circuit board or metal pads for attachment to an electrical connector. The SiPh interposer platform 300 can be produced in large batches on a single wafer of silicon through fabrication and etching processes including photolithography. The platform can then be singulated into pieces, each containing a copy of, e.g., the SiPh interposer platform 300. BGA 354 is a type of surface-mount packaging for various circuitry used to, for example, permanently mount devices and associated components onto larger printed circuit boards. BGA 354 can provide multiple interconnection pins than can be put on a customizable platform. Thus, the bottom surface of the platform can be used for connectivity in addition to connections along the perimeter. The use of BGA 354 also allows for shorter trace lengths compared to a device utilizing only the perimeter for connections, resulting in improved performance at increased speeds.

Mounted on the side of SiPh interposer 320 opposite the BGA can be a plurality of metal pads, copper pillar, or microballs 356 to provide connectivity to a computing chip 350. Through silicon vias and redistribution layers provide electrical connectivity between the microballs 356 and BGA 354. The computing chip 350 can be, for example, an integrated circuit chip or a monolithic integrated circuit (also referred to as an IC or a microchip). An application-specific integrated circuit (ASIC) can also be employed. For example, an ASIC is a type of IC that has been customized for a particular purpose, reducing the complexity and cost relative to a general-purpose chip. Optical gratings 326 can be used to facilitate transmission and receipt of signals 330, 332 to and from the computing chip 350. For example, gratings 326 can be connected to a transceiver, which comprises both a transmitter and a receiver to share common circuitry or a single housing. In order for optical signals 330, 332 to relay information through optical fibers housed in optical fiber connector 340, the signals 330, 332 are modulated to encode data in the form of optical pulses, or the signals 330, 332 can be detected and converted into parsable data. For example, an outgoing optical signal (e.g., 330) can be modulated in order to convey digital information through a transmission medium, such as through an optical fiber. The assembly described herein is capable of performing both modulation and detection operations. Moreover, an incoming signal (e.g., 332) can be received, detected and converted into electronic data by photodetectors, which can then be processed by computing chip 350.

The processing required by computing chip 350 generates an amount of heat that, if allowed to build, could degrade signal integrity or components. Thus, a heat sink 352 can be provided in thermal communication with the computing chip 350. Heat sink 352 can be a passive heat exchanger to cool components by dissipating heat into the surrounding environment. The heat sink 352 is designed to maximize its surface area in contact with the relatively cooler environment, such as the open air.

Moreover, the SiPh interposer platform 300 as described herein can utilize a modified optical fiber connector that can transmit an optical signal through an optical turn. An optical turn can be introduced by use of a turning mirror (not shown). In such an implementation, a lower profile SiPh interposer platform can also be achieved by using expanded beam optical connectors with integrated turning mirrors. Alternatively, the optical fiber can be bent to introduce an angle to the optical signal.

Figure 4:
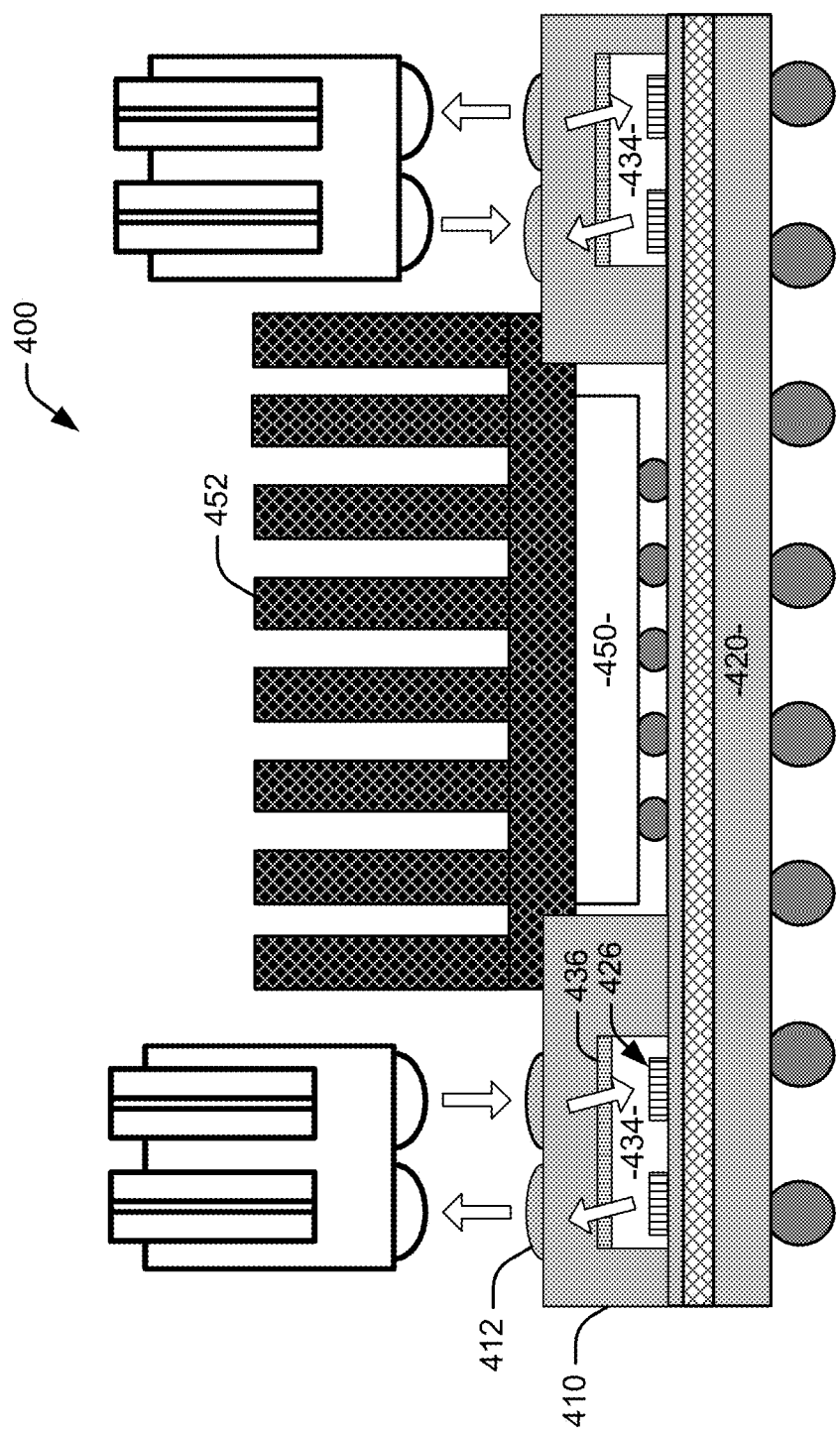
FIG. 4 illustrates another example SiPh interposer assembly with associated components.

FIG. 4 illustrates another example SiPh interposer platform 400. The SiPh interposer platform 400 comprises one or more silicon wafers 410 having one or more lenses 412. The wafer 410 is formed with a cavity 434. The wafer 410 is bonded to the SiPh interposer 420, such that the cavity 434 encloses the gratings 426 formed on the SiPh interposer 420. An antireflective coating 436 can be applied at the cavity 434/wafer 436 and lens 412/air interfaces. Additionally, due to the relatively higher thermal conductivity in the wafer 410 in the example of FIG. 4, wafer 410 can reduce the effective thermal resistance between the SiPh interposer 420 and heat sink 452. Heat sink 452 can be in thermal communication with both the wafer 410 and a computing chip 450.

Figure 5:
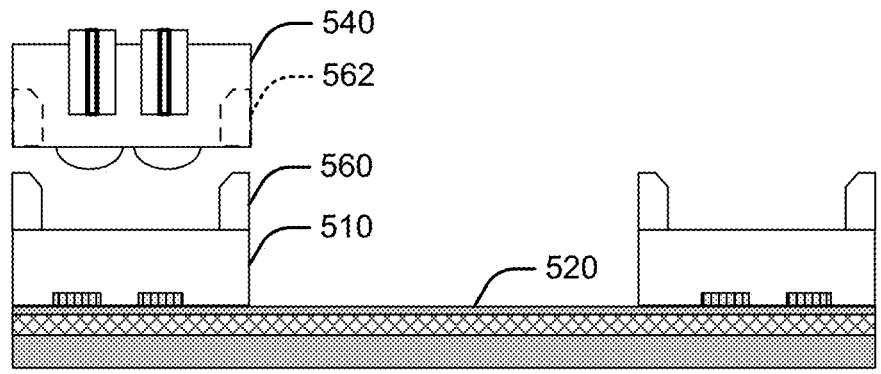
FIGS. 5-7 illustrate examples of mating features for SiPh interposer assemblies.
Figure 6:
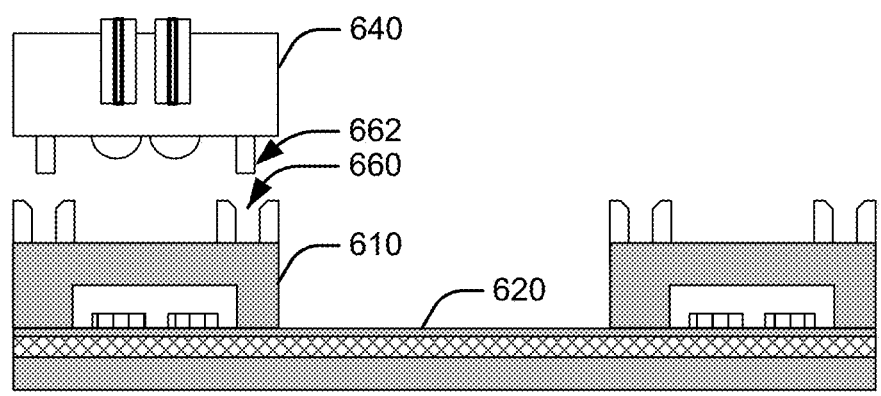
Figure 7:
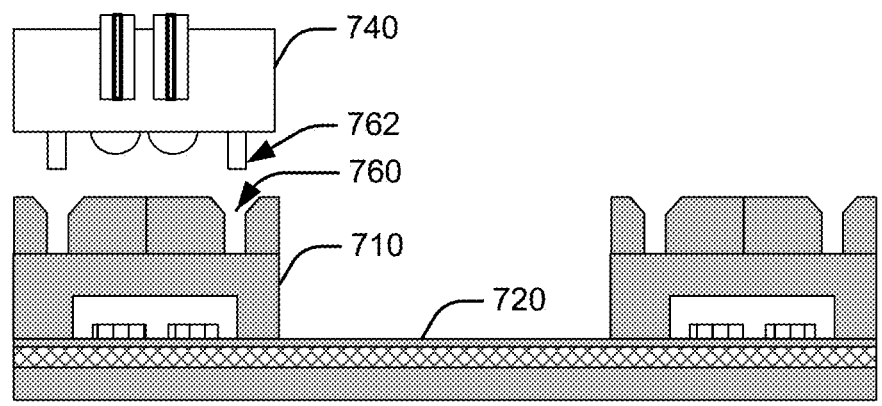

FIGS. 5-7 illustrate mechanical alignment features to facilitate attachment of an optical fiber connector to a glass or silicon wafer of a SiPh interposer platform, as described herein. The mechanical alignment features of the wafer are formed to mate with the corresponding mechanical alignment features of optical fiber connectors to ensure desired alignment of signal transfer components (e.g., grating couplers and fiber optic cables). As shown in FIG. 5, wafer 510 comprises a glass material and is bonded to SiPh interposer 520. The wafer 510 can be formed with one or more pillars 560 on opposite ends of a mating surface to mate with holes 562 of optical fiber connector 540. The pillars 560 can be formed of a material, for example a polymer, an electroplated metal, or silicon, which is suitable to endure stress on the platform during application of the optical fiber connector 540. The pillars may have chamfered or rounded ends.

In the example of FIG. 6, wafer 610 can comprise either a glass or silicon material. As shown, wafer 610 comprises silicon, and is formed with a cavity, as explained with respect to wafer 210 of FIG. 2. The wafer 610 can be bonded to a SiPh interposer 620. The wafer 610 can be formed with two holes 660 on opposite ends of a mating surface of the wafer 610 to mate with two pins 662 on each end of the mating surface of the optical fiber 640. Each pin 662 is formed to align with the two holes 660 in a manner to mechanically align and secure the optical fiber connector 640 to the wafer 610.

FIG. 7 illustrates a wafer 710 comprising silicon and formed on a SiPh interposer 720. The wafer 710 is formed with a layer of silicon that can be etched in order to form one or more holes 760 on the mating surface of the wafer 710. A pin 762 can be aligned to mate with a space formed during etching of the silicon hole 760 to provide stability and alignment for the optical fiber connector 740 and the wafer 710. The hole 760 may be chamfered or tapered.

It will be understood that additional and/or alternative features, such as the mechanical alignment features described in FIGS. 5-7, can be implemented on various examples with modifications that would suit a desired or alternative application, although every conceivable variation is not described herein.

Figure 8:
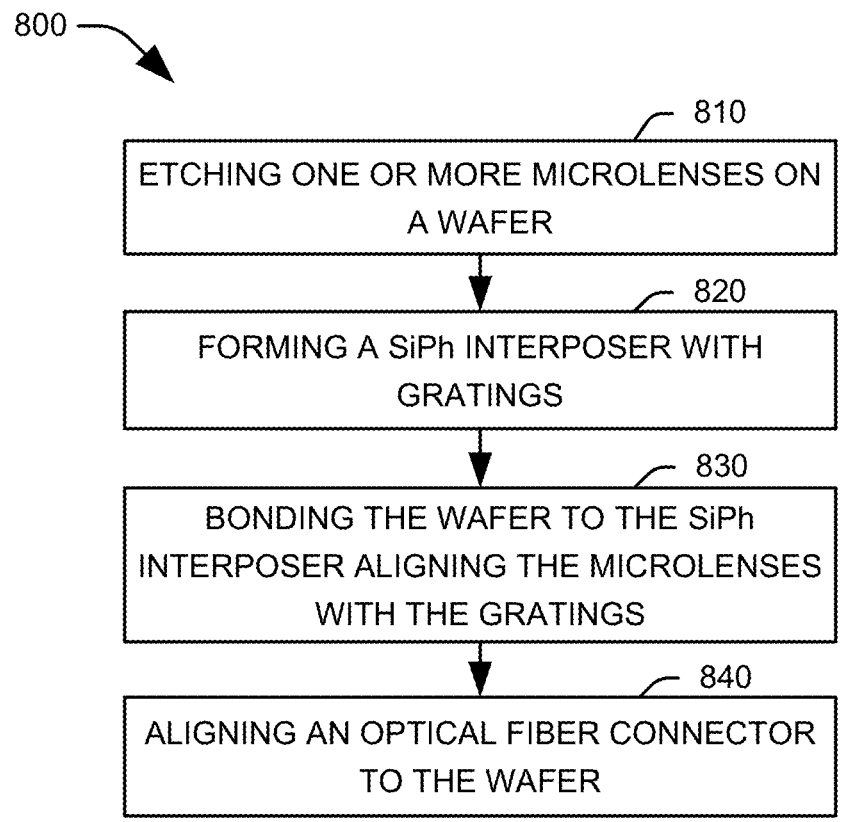
FIG. 8 illustrates an example method of making a SiPh interposer assembly.

In view of the foregoing structural and functional features described above, example methods of making a SiPh interposer platform (e.g., the SiPh interposer platform 300 of FIG. 3, and the SiPh interposer platform 400 of FIG. 4) will be better appreciated with reference to FIG. 8. In the example of FIG. 8, various types of process parameters can be utilized at various steps according to application requirements and the structures being fabricated and materials used in such fabrication. While, for purposes of simplicity of explanation, the method of FIG. 8 is shown and described as executing serially, the method is not limited by the illustrated order, as some actions could in other examples occur in different orders and/or concurrently from that shown and described herein.

FIG. 8 provides a method 800 of fabricating a silicon photonic (SiPh) interposer assembly. At 810, the method includes etching one or more microlenses on a given surface of a wafer. At 820, a SiPh interposer is formed by fabricating an insulator on a substrate. An active layer can also be fabricated on another surface of the insulator that is opposite the substrate. Additionally, one or more gratings are etched on a surface of the active layer that is opposite the insulator. At 830, the wafer is bonded to the active layer such that the one or more microlenses are aligned with respect to the gratings on the substrate. At 840, one or more optical fibers of an optical fiber connector are aligned to the one or more microlenses of the wafer.

The method described in FIG. 8 can form the components by a variety of techniques. For example, silicon CMOS processes and MEMS foundries can be utilized to manufacture the SiPh interposer platform. CMOS is a technology for constructing integrated circuits and silicon components such as microprocessors, microcontrollers, memory components, and other circuits. CMOS technology is also used for several analog circuits such as data converters and transceivers, such as can be utilized with the assemblies and platforms described herein.

Moreover, MEMS foundries employ processes to fabricate components on the wafer scale. The processes would include wafer bonding and various etching techniques. Wafer bonding or the like can be employed to fabricate additional layers of one or more active structures or components. Fabrication can, for example, be performed by applying appropriate deposition and/or etching techniques to a stack of materials (e.g., III-V semiconductor compound materials), although the examples described are not limited to these techniques. For example, fabrication can include epitaxially growing a stack of materials (e.g., III-V semiconductor compound materials). Epitaxial growth is a technique that can be used to fabricate various electronic and optical devices. Such devices can have a complicated structure, which may be formed from a number of thin layers with various compositions. Fabrication can, for example, include utilizing photolithography to pattern predetermined variations in the structure.

During the photolithography process, a photoresist or other masking material can be used to define the dimensions of specific components. A photoresist may be formed over various layers via conventional spin-coating or spin casting deposition techniques. For example, a patterned photoresist can serve as an etch mask layer for processing or etching an underlying silicon substrate, such as by employing reactive ion etching (RIE). A silicon substrate can be anisotropically etched with one or more plasma gases, such as carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of a patterned photoresist layer. Deposition of layered material can be conducted to passivate the etched interface to make high-performance photonic components and integrated circuits.

Subsequent to the etching process, the wafer can be bonded to the SiPh interposer by a bonding agent, resulting in a layered structure. Advantageously, by utilizing the SiPh packaging assembly described herein, electrical connectors are not required. Thus, a solder reflowable technique can be used to bond components to provide a SiPh interposer assembly with detachable alignment tolerant optical connectors. Reflow soldering is a process in which a solder is used to attach electrical components to contacts on a circuit board, after which the entire assembly is subjected to a heat source. Applying heat serves to melt the solder to permanently bond the components. Thus, bonding components by a reflow soldering is less costly and less and less damaging than other fabrication techniques. The reflow process can be implemented at temperatures that melt the solder and heat the adjoining surfaces without overheating and damaging the associated electrical components. An ASIC can be solder reflowed and underfilled to the SiPh interposer assembly. In turn, the SiPh interposer assembly can be solder reflowed to a larger PCB. Furthermore, a heat sink can be attached separately, to the chip, the wafer, or both. The wafer-bonding process can include, but not limited to, fusion, anodic, adhesive, metal bonding, or the like.

Figure 9:
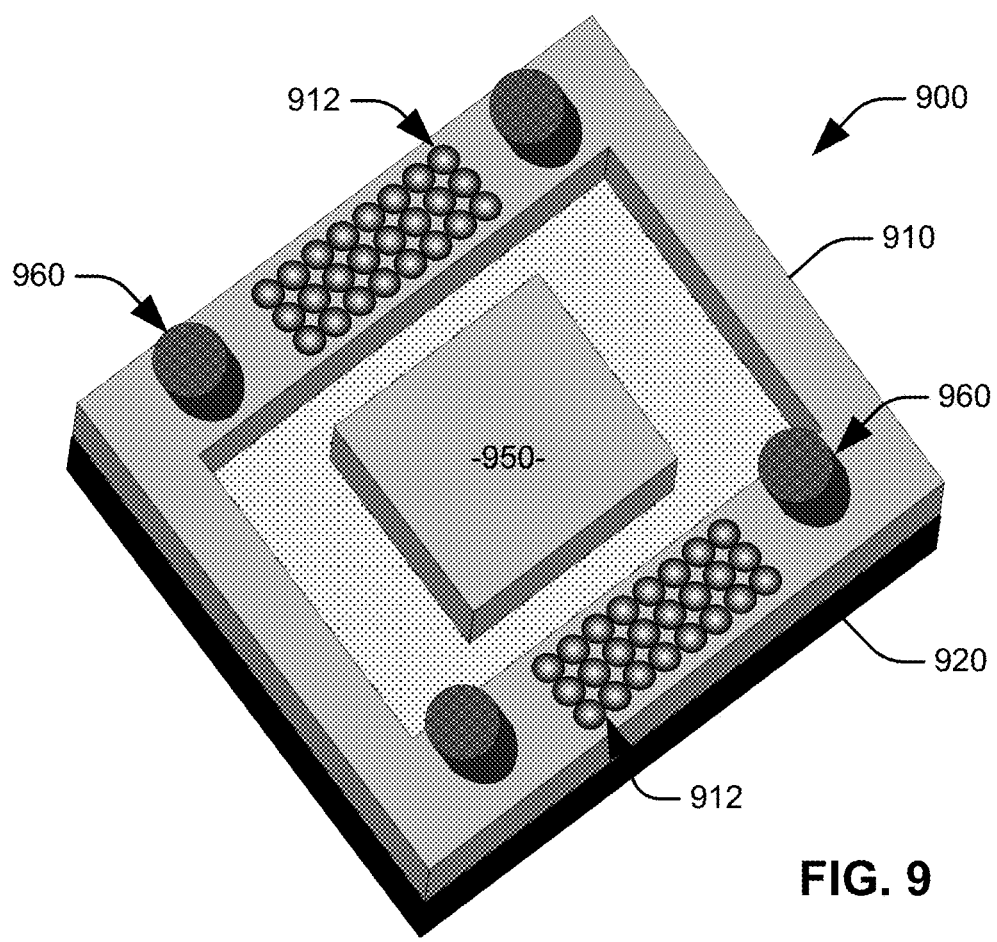
FIG. 9 illustrates a perspective view of an example SiPh interposer assembly.

By way of further example, FIG. 9 provides perspective view of a SiPh interposer platform 900 that has been formed in a manner consistent with the examples described herein. The platform 900 of FIG. 9 demonstrates a SiPh substrate 920 with a wafer 910 bonded thereon. Etched on the wafer 910 are a plurality of microlenses 912 and one or more mechanical alignment features 960. As shown, a 3×8 grid of microlenses 912 is provided on an exposed surface of the wafer 910. Each of the microlenses 912 can be aligned with respect to an optical grating formed on the SiPh substrate 920 at the interface with the surface of the wafer 910 opposite the microlenses 912. Moreover, each microlens 912 can be aligned with an optical fiber by mating an optical fiber connector with the mating features 960, as described herein. Additionally, although two surfaces of the wafer 910 are shown with a grid of microlenses 912, one surface or more than two surfaces of the wafer 910 can be formed with microlenses 912. One or more devices can be formed on the SiPh substrate 920 in communication with the microlenses 912. As shown, a device 950, such as a computing chip, is flip chipped onto SiPh substrate 920 substantially enclosed by the wafer 910. Thus, FIG. 9 provides an illustration of an example SiPh interposer platform as described in FIGS. 3-7.

Furthermore, relative terms used to describe the structural features of the figures illustrated herein, such as above and below, up and down, first and second, near and far, etc., are in no way limiting to conceivable implementations. For instance, where examples of the structure described herein are described in terms consistent with the figures being described, and actual structures can be viewed from a different perspective, such that above and below may be inverted, e.g., below and above, or placed on a side, e.g., left and right, etc. Such alternatives are fully embraced and explained by the figures and description provided herein.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A silicon photonic (SiPh) packaging assembly comprising:
   a silicon interposer with one or more optical gratings disposed on the interposer to couple an optical signal; and
   a wafer bonded to the interposer, the wafer comprising:
      one or more microlenses, each microlens aligned with respect to an optical grating and designed to direct the optical signal traversing the wafer at a desired angle; and
      a cavity filled with a low refractive index material to enclose an area surrounding the one or more optical gratings.

2. The assembly of claim 1, wherein the wafer and microlenses comprise an optical glass or optical glass ceramic having a coefficient of thermal expansion (CTE) substantially equivalent to silicon.

3. The assembly of claim 1, wherein the wafer and microlenses comprise silicon.

4. The assembly of claim 1, the wafer further comprising a given and another surface, the given surface having the one or more microlenses formed thereon, and the another surface forming a surface of the cavity opposite to and parallel with a surface of the interposer with the one or more gratings disposed thereon, wherein the given surface and the another surface have an antireflective coating to prevent signal loss.

5. The assembly of claim 1, the microlenses comprising an antireflective coating on a surfaces interface with air to prevent signal loss.

6. The assembly of claim 1, further comprising an optical connector comprising a given mechanical alignment feature designed to mate with another mechanical alignment feature of the wafer, the optical connector comprising one or more lenses aligned with one or more optical fibers, each lens corresponding to a respective microlens of the wafer.

7. The assembly of claim 6, wherein the given mechanical alignment feature is a pin designed to join with a hole formed on the another mechanical alignment feature.

8. The assembly of claim 1, further comprising an integrated chip (IC) disposed on the interposer and one or more heat sinks in thermal communication with at least one of the integrated chip and the wafer.

9. A method of fabricating a silicon photonic (SiPh) interposer assembly, comprising:
   etching one or more microlenses on a given surface of a wafer;
   forming a cavity in the wafer to have two or more sidewalls orthogonal to another surface of the wafer the another surface being opposite to and parallel with the given surface of the active layer;
   forming a SiPh interposer, comprising:
      forming an insulator on a given surface of a substrate;
      forming an active layer on another surface of the insulator that is opposite the substrate;
      etching one or more gratings on a given surface of the active layer that is opposite the insulator; and
      bonding the another surface of the wafer to the given surface of the active layer, wherein the another surface of the wafer is opposite to and parallel with the given surface of the active layer, such that an area surrounding the one or more optical gratings is enclosed by the cavity; and
   aligning the one or more microlenses with the one or more gratings to direct an optical signal traversing the wafer at a desired angle.

10. The method of claim 9, wherein the IC and the SiPh interposer are bonded by a solder reflowable technique.

11. The method of claim 9, further comprising forming one or more mechanical alignment features on the given surface of the wafer from a material comprising one of a polymer, an electroplated metal, glass, and silicon.

12. The method of claim 9, wherein the wafer comprises silicon.

13. The method of claim 9, further comprising applying an antireflective coating to the given and the another surfaces of the wafer to prevent signal loss.

14. A silicon photonic (SiPh) packaging assembly comprising:
   a silicon interposer comprising:
      an insulator on a given surface of a substrate;
      an active layer on another surface of the insulator that is opposite the substrate, wherein a given surface of the active layer that is opposite the insulator comprises one or more optical gratings; and a wafer comprising:
      a given surface comprising:
         one or more microlenses etched into the wafer;
         one or more mechanical alignment features to mate with an optical fiber connector; the mechanical alignment features being made from a material including one of a polymer, an electroplated metal, glass, and silicon; and
      another surface opposite to and parallel with the given surface of the wafer, the another surface being bonded to the given surface of the active layer and aligned to direct an optical signal traversing the wafer to the one or more gratings at a desired angle, the another surface comprising a cavity filled with a low refractive index material to enclose an area surrounding the one or more optical gratings.

* * * * *